(12) United States Patent
Thees et al.

(10) Patent No.: US 9,281,200 B2
(45) Date of Patent: Mar. 8, 2016

(54) ENHANCED PATTERNING UNIFORMITY OF GATE ELECTRODES OF A SEMICONDUCTOR DEVICE BY LATE GATE DOPING

(75) Inventors: Hans-Juergen Thees, Dresden (DE); Sven Beyer, Dresden (DE); Martin Mazur, Pulsnitz (DE); Steffen Laufer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/189,997

(22) Filed: Jul. 25, 2011

(65) Prior Publication Data

US 2012/0156865 A1 Jun. 21, 2012

(30) Foreign Application Priority Data

Dec. 21, 2010 (DE) .......................... 10 2010 063 778

(51) Int. Cl.
H01L 21/8238 (2006.01)
H01L 21/28 (2006.01)
H01L 21/265 (2006.01)
H01L 21/8234 (2006.01)
H01L 29/49 (2006.01)

(52) U.S. Cl.
CPC ........ *H01L 21/28123* (2013.01); *H01L 21/265* (2013.01); *H01L 21/28035* (2013.01); *H01L 21/82345* (2013.01); *H01L 21/823842* (2013.01); *H01L 29/4916* (2013.01)
USPC ..... 438/199; 438/514; 438/585; 257/E21.623

(58) Field of Classification Search
USPC ......................................................... 438/532
See application file for complete search history.

(56) References Cited

U.S. PATENT DOCUMENTS

| | | | |
|---|---|---|---|
| 5,665,621 A * | 9/1997 | Hong | 438/278 |
| 6,566,184 B1 | 5/2003 | Wei et al. | 438/232 |
| 6,582,995 B2 * | 6/2003 | Hsieh et al. | 438/143 |
| 2002/0197839 A1 * | 12/2002 | Dokumaci et al. | 438/587 |
| 2003/0098486 A1 | 5/2003 | Sambonsugi et al. | 257/371 |
| 2005/0233532 A1 | 10/2005 | Lenski et al. | 438/301 |
| 2006/0068539 A1 * | 3/2006 | Park et al. | 438/199 |
| 2006/0094183 A1 * | 5/2006 | Wieczorek et al. | 438/202 |

(Continued)

FOREIGN PATENT DOCUMENTS

DE 102004015864 B4 10/2007 ............ H01L 21/336

OTHER PUBLICATIONS

Translation of Official Communication from German Patent Office for German Patent Application No. 10 2010 063 778.5 dated Aug. 19, 2011.

(Continued)

*Primary Examiner* — Evan Pert
*Assistant Examiner* — Shaka White
(74) *Attorney, Agent, or Firm* — Amerson Law Firm, PLLC

(57) ABSTRACT

When forming sophisticated semiconductor-based gate electrode structures of transistors, the pre-doping of one type of gate electrode structure may be accomplished after the actual patterning of the electrode material by using an appropriate mask or fill material for covering the active regions and using a lithography mask. In this manner, a high degree of flexibility is provided with respect to selecting an appropriate patterning regime, while at the same time a uniform and superior cross-sectional shape for any type of gate electrode structure is obtained.

22 Claims, 6 Drawing Sheets

(56) References Cited

U.S. PATENT DOCUMENTS

| | | | |
|---|---|---|---|
| 2008/0237743 A1 | 10/2008 | Ramin et al. | 257/407 |
| 2009/0039439 A1* | 2/2009 | Ramin et al. | 257/369 |
| 2009/0090971 A1* | 4/2009 | Chang et al. | 257/351 |
| 2009/0098737 A1* | 4/2009 | Doris et al. | 438/742 |
| 2009/0117726 A1* | 5/2009 | Pas | 438/592 |
| 2009/0166748 A1* | 7/2009 | Takahashi | 257/369 |
| 2009/0191675 A1* | 7/2009 | Mehrad et al. | 438/218 |

OTHER PUBLICATIONS

Translation of Official Communication from German Patent Office for German Patent Application No. 10 2010 063 778.5 dated Jan. 20, 2015.

* cited by examiner

ENHANCED PATTERNING UNIFORMITY OF GATE ELECTRODES OF A SEMICONDUCTOR DEVICE BY LATE GATE DOPING

BACKGROUND OF THE INVENTION

1. Field of the Invention

Generally, the subject matter disclosed herein relates to integrated circuits, and, more particularly, to semiconductor-based gate electrode structures formed by sophisticated lithography and etch techniques.

2. Description of the Related Art

The fabrication of microstructures, such as integrated circuits, requires tiny regions of precisely controlled size to be formed in one or more material layers of an appropriate substrate, such as a silicon substrate, a silicon-on-insulator (SOI) substrate or other suitable carrier materials. These tiny regions of precisely controlled size are typically defined by patterning the material layer(s) by applying lithography, etch, implantation, deposition processes and the like, wherein, typically, at least in a certain stage of the patterning process, a mask layer may be formed over the material layer(s) to be treated to define these tiny regions. Generally, a mask layer may consist of or may be formed by means of a layer of resist that is patterned by a lithographic process, typically a photolithography process. During the photolithography process, the resist may be spin-coated onto the substrate surface and then selectively exposed to ultraviolet radiation through a corresponding lithography mask, such as a reticle, thereby imaging the reticle pattern into the resist layer to form a latent image therein. After developing the photoresist, depending on the type of resist, positive resist or negative resist, the exposed portions or the non-exposed portions are removed to form the required pattern in the layer of photoresist. Based on this resist pattern, actual device patterns may be formed by further manufacturing processes, such as etching, implantation and the like. Since the dimensions of the patterns in sophisticated integrated microstructure devices are steadily decreasing, the equipment used for patterning device features have to meet very stringent requirements with regard to resolution and overlay accuracy of the involved fabrication processes. In this respect, resolution is considered as a measure for specifying the consistent ability to print minimum size images under conditions of predefined manufacturing variations. One important factor in improving the resolution is the lithographic process, in which patterns contained in the photo mask or reticle are optically transferred to the substrate via an optical imaging system. Therefore, great efforts are made to steadily improve optical properties of the lithographic system, such as numerical aperture, depth of focus and wavelength of the light source used.

The resolution of the optical patterning process may, therefore, significantly depend on the imaging capability of the equipment used, the photoresist materials for the specified exposure wavelength and the target critical dimensions of the device features to be formed in the device level under consideration. For example, gate electrodes of field effect transistors, which represent an important component of modern logic devices, may have a length of less than 40 nm in currently produced devices, with significantly reduced dimensions for device generations that are currently under development. Consequently, the actual feature dimensions may be well below the wavelength of currently used light sources provided in current lithography systems. For example, presently, in critical lithography steps, an exposure wavelength of 193 nm may be used, which, therefore, may require complex techniques for finally obtaining resist features having dimensions well below the exposure wavelength. Thus, highly non-linear processes are typically used to obtain dimensions below the optical resolution. For example, extremely non-linear photoresist materials may be used, in which a desired photochemical reaction may be initiated on the basis of a well-defined threshold so that weakly exposed areas may not substantially change at all, while areas having exceeded the threshold may exhibit a significant variation of their chemical stability with respect to a subsequent development process.

Consequently, significant advances and development of appropriate photoresist materials in combination with the progresses made in providing highly complex imaging tools may enable the printing of mask features having critical dimensions that are significantly less compared to the exposure wavelength used. Moreover, additional process techniques may be applied, which enable a further reduction of the resist features, thereby even further reducing the critical dimensions of circuit elements. For example, appropriate hard mask features may be formed on the basis of sophisticated trim etch techniques having a width of approximately 50 nm, thereby enabling the patterning of gate electrode structures having a gate length that substantially corresponds to the width of the mask features. Upon further reducing the overall dimensions of sophisticated semiconductor devices, not only the length of the gate electrode structure has to be reduced, for instance to 40 nm and less, but also the width of the gate electrode structures have to be reduced to several hundred nanometers and significantly less, in particular in densely packed device areas, such as static RAM areas in complex semiconductor devices. In this case, sophisticated trim etch techniques may not allow an appropriate reduction of the gate width. For this reason, and due to the fact that critical lithography processes may be controlled more efficiently by having to print resist features, which have a critical dimension in one lateral direction only, it has been proposed to split the patterning process for providing appropriate resist features for sophisticated gate electrode structures into two steps in order to appropriately adjust the gate length, for instance on the basis of trim etch techniques, and the gate width, thereby allowing reduced transistor width, as is frequently required in critical device areas, such as RAM areas.

Upon further shrinkage of the critical transistor dimensions, however, the very critical gate patterning process may suffer from increased process non-uniformities, which may be related to the sophisticated etch process strategies, which may be required in combination with the sophisticated lithography techniques described above. It is well known that sophisticated anisotropic plasma-based etch strategies may critically depend on process parameters, such as the amount of polymerizing gas components, which are typically added in a certain amount to the actual reactive chemicals in order to adjust the lateral etch rate and thus the resulting profile of the gate electrode structure obtained on the basis of a hard mask, which may be formed in accordance with the highly advanced lithography techniques, possibly in combination with trim etch processes and the like. For example, in sophisticated polysilicon-based gate electrode structures, the total etch rate critically depends on the material conditions of the polysilicon material so that even subtle variations in the etch rate may result in a variation of the etch profile and thus possibly of the finally obtained electrically effective gate length. It turns out that, in combination with sophisticated lithography techniques, using a hard mask approach patterned on the basis of a double etch process, as described above, may result in significant variations of the resulting gate profile when the anisotropic etch processes are appropriately adapted so as to obtain the desired effective gate length, since typically the polysilicon material of the different transistor types may require a different type of doping, which, however, may result in a certain interaction with the corresponding reactive ion etching process, as will be described in more detail with reference to FIGS. 1a-1g.

FIG. 1a schematically illustrates a cross-sectional view of a semiconductor device 100 in an early manufacturing stage in which a stack of layers 161, 162, 163 is formed on a semiconductor layer 102, which may comprise a plurality of active regions or semiconductor regions 102A, 102B. The semiconductor layer 102, such as a silicon layer, is formed above a substrate 101, such as a crystalline silicon material and the like, wherein, if required, a buried insulating material (not shown) may be provided between the substrate 101 and the semiconductor layer 102, if an SOI architecture is to be used. The semiconductor layer 102 may comprise appropriate configured isolation regions (not shown), such as shallow trench isolations, in order to appropriately laterally delineate the active regions 102A, 102B. In this context, an active region is to be understood as a semiconductor region in and above which one or more transistors are to be formed. For example, the active region 102A may correspond to an active region in and above which an N-channel transistor is to be formed, while the active region 102B may correspond to a P-channel transistor.

The layers 161, 162 and 163 may represent a gate layer stack comprising the layer 161 in the form of a gate dielectric material, such as a silicon oxynitride material having a thickness of approximately one nanometer to several nanometers, depending on the performance grade required for the transistors to be formed in and above the active regions 102A, 102B. It should be appreciated that the dielectric layer 161 may have a different thickness in different device areas, if considered appropriate. The layer 162 is typically provided in the form of a polysilicon material, wherein, if required, a substantially uniform dopant concentration may be provided in order to adjust the basic characteristics of the layer 162, at least for one type of gate electrode structure. Furthermore, the layer 163 may be provided in the form of an oxide layer with an appropriate thickness of several nanometers in order to act as an efficient etch stop material during the further processing and to passivate the polysilicon material layer 162.

The device 100 as illustrated in FIG. 1a may be formed on the basis of well-established process techniques. That is, appropriate isolation structures (not shown) are formed in the semiconductor layer 102, thereby defining the lateral size, position and shape of the active regions 102A, 102B. Prior to or after forming the isolation structures, dopant species are incorporated into the active regions 102A, 102B in order to adjust the basic transistor characteristics, such as conductivity type, threshold voltage and the like. After removing any surface layers, which may have been formed during the process of forming the isolation structures, the gate dielectric layer 161 is formed by oxidation and/or deposition, depending on the overall process strategy. For example, a plurality of well-established oxidation recipes are available in order to form the layer 161 in a highly controlled manner so as to obtain the desired thickness. If required, an increased thickness may be established in specific device areas. Thereafter, the electrode material 162 is deposited on the basis of, for instance, well-established low pressure chemical vapor deposition (CVD) recipes, wherein, if required, a specific concentration of a dopant species may be incorporated in a highly uniform manner so that, after the deposition of the layer 162, substantially homogeneous material characteristics are obtained in order to enable an appropriate adaptation of etch parameters, as discussed above. Moreover, the layer 163 is formed, for instance, by deposition or oxidation in order to passivate the material 162.

FIG. 1b schematically illustrates the semiconductor device 100 when exposed to an ion bombardment 104, which is performed on the basis of an appropriate implantation mask 103 which exposes a specific portion of the layer 162, which requires a specific type of doping in order to comply with the overall transistor characteristics. For example, it may be assumed that an N-type dopant species is to be implanted, thereby forming a layer portion 162A, which thus differs in its dopant concentration from the remaining material 162. The implantation process 104 and the resist mask 103 are formed on the basis of well-established lithography techniques and implantation recipes, wherein the process parameters, such as dose and energy, are appropriately adapted so as to avoid undue penetration of the underlying active region 102A.

FIG. 1c schematically illustrates the device 100 after the removal of the resist mask 103 (FIG. 1b) and after the deposition of a hard mask layer 164, which may be provided in the form of a silicon nitride material and the like. To this end, well-established deposition techniques are applied.

FIG. 1d schematically illustrates the device 100 in a further advanced manufacturing stage in which a layer system 105, generally indicated as a lithography stack, is formed above the hard mask 164 and may comprise any appropriate materials, such as resist material, possibly in combination with planarization materials, anti-reflecting coating (ARC) materials and the like, as required by the complex lithography strategy in order to appropriately pattern the hard mask layer 164 in accordance with the desired lateral dimensions. Thereafter, appropriate lithography strategies may be applied, for instance, comprising double exposure regimes and the like, possibly in combination with etch trim processes and the like, in order to provide an appropriate mask for patterning the hard mask layer 164.

FIG. 1e schematically illustrates corresponding mask features 105A, 105B, which may substantially comply with the lateral dimensions of gate electrode structures to be formed from the layer 162 by appropriately patterning the hard mask layer 164. As illustrated, the mask feature 105A is positioned above the pre-doped portion 162A of the electrode material 162. Thereafter, a patterning process is applied in order to pattern the hard mask layer 164, wherein also double etch strategies may be applied, as is also discussed above, depending on the overall process strategy.

FIG. 1f schematically illustrates the device 100 in a stage in which hard mask features 164A, 164B are formed above the layer 162 including the pre-doped portion 162A, wherein the hard mask features 164A, 164B may thus substantially represent the desired critical dimensions of gate electrode structures to be formed from the layer 162. During the corresponding patterning process, the layer 163 may act as an efficient etch stop material, which may be subsequently removed or opened in order to etch into the layer 162 on the basis of sophisticated plasma assisted etch recipes, using the features 164A, 164B as an etch mask. As discussed above, in critical patterning processes, the lateral etch rate may significantly depend on a plurality of sensitive process parameters, wherein these parameters are typically adjusted so as to obtain a desired length at the bottom of the resulting gate electrode structures, since the bottom of the gate electrode substantially determines the electrically effective gate length, which in turn determines the finally obtained transistor characteristics.

FIG. 1g schematically illustrates the semiconductor device 100 after the above-described complex patterning process, thereby providing gate electrode structures 160A, 160B. As illustrated, the gate electrode structures 160A, 160B comprise the hard mask features 164A, 164B, respectively, in combination with the layer 163. Furthermore, the gate electrode structure 160B comprises the patterned portion of the layer 162, which may have a desired cross-sectional shape. On the other hand, the gate electrode structure 160A comprising the pre-doped portion 162A may exhibit a pronounced non-uniformity of the etch profile, wherein a length 162L at the top of the material 162A may be significantly reduced compared to the gate length at the bottom of the gate electrode structure 160A. As discussed above, the patterning process is typically optimized so as to obtain the desired gate length at the bottom, which may result in a substantially uniform profile of the material 162 in the gate electrode structure 160B, while the previously performed pre-doping may produce a substantially "bottleneck" shape for the gate electrode structure 160A, in particular when this gate electrode structure represents the gate electrode structure of an N-channel transistor.

Consequently, upon forming sophisticated transistors having a gate length of 40 nm and less, the pronounced narrowing or generally the pronounced non-uniformity in the gate profile may thus also result in significant variations of the resulting transistor characteristics and may even result in a total failure of the corresponding transistor element. For example, during the further processing, sophisticated spacer structures may have to be provided and which may be used for appropriately establishing the dopant profiles for drain and source regions so that any non-uniformities may also directly translate into non-uniformities of the complex lateral and vertical dopant profiles of the corresponding drain and source regions.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which gate electrode structures are provided on the basis of appropriate lithography and patterning regimes in which superior controllability and scalability of the gate profiles may be achieved by providing the semiconductor-based electrode material, such as the polysilicon material, with substantially uniform material characteristics, in particular with respect to any dopant species incorporated therein for any type of transistor, while a corresponding adaptation of the dopant concentrations may be achieved in a later manufacturing stage, i.e., after patterning the gate electrode structures. To this end, undue incorporation of the dopant species into underlying active semiconductor areas may be avoided by providing an appropriate mask or fill material. Consequently, high flexibility may be provided on the basis of the principles disclosed herein with respect to applying lithography strategies and patterning regimes, for instance using well-established process techniques, wherein the resulting gate profiles are highly uniform. Moreover, any conventional strategy may be avoided in which the gate patterning process may be performed on the basis of "soft masks" in which resist material may be present during the actual patterning of the gate electrode material, which, however, may significantly restrict the resulting process window, in particular when double patterning strategies may have to be applied.

One illustrative method disclosed herein relates to forming a gate electrode structure of a semiconductor device. The method comprises forming a gate layer stack above an active region, wherein the gate layer stack comprises an electrode material comprised of a semiconductor material. The method further comprises patterning the gate layer stack by using a hard mask and an etch process that is adapted to the electrode material so as to form the gate electrode structure above the active region. Additionally, the method comprises forming a mask material above the active region and performing an implantation process so as to incorporate a dopant species into the semiconductor material of the electrode material while using the mask material as an implantation mask.

A further illustrative method disclosed herein relates to forming a semiconductor device. The method comprises forming a gate layer stack above a first active region and a second active region, wherein the gate layer stack comprises a semiconductor electrode material having a uniform material composition. The method further comprises forming a first gate electrode structure above the first active region and a second gate electrode structure above the second active region from the gate layer stack. Additionally, the method comprises forming a mask material laterally adjacent to the first and second gate electrode structures so as to cover the first and second active regions. Moreover, a dopant species is selectively implanted into the semiconductor electrode material of the first gate electrode structure in the presence of the mask material.

A still further illustrative method disclosed herein relates to forming gate electrode structures. The method comprises forming a first gate electrode structure and a second gate electrode structure from a gate layer stack, wherein the first and second gate layer stacks are formed above first and second semiconductor regions, respectively. Additionally, the method comprises incorporating a dopant species selectively into a semiconductor electrode material of the first gate electrode structure while masking the first and second semiconductor regions and the second gate electrode structure.

BRIEF DESCRIPTION OF THE DRAWINGS

The disclosure may be understood by reference to the following description taken in conjunction with the accompanying drawings, in which like reference numerals identify like elements, and in which.

Figure 1A:
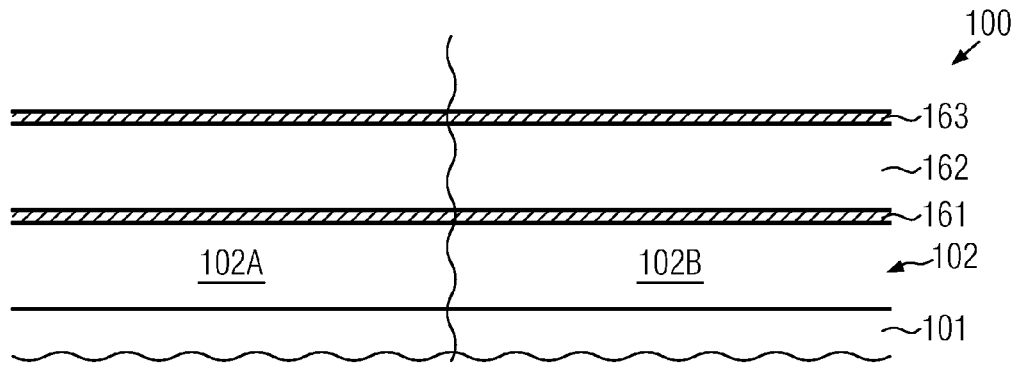
FIGS. 1a-1g schematically illustrate cross-sectional views of a semiconductor device during a complex patterning process for forming gate electrode structures with a pre-doping process for one gate electrode structure, according to conventional strategies.
Figure 1B:
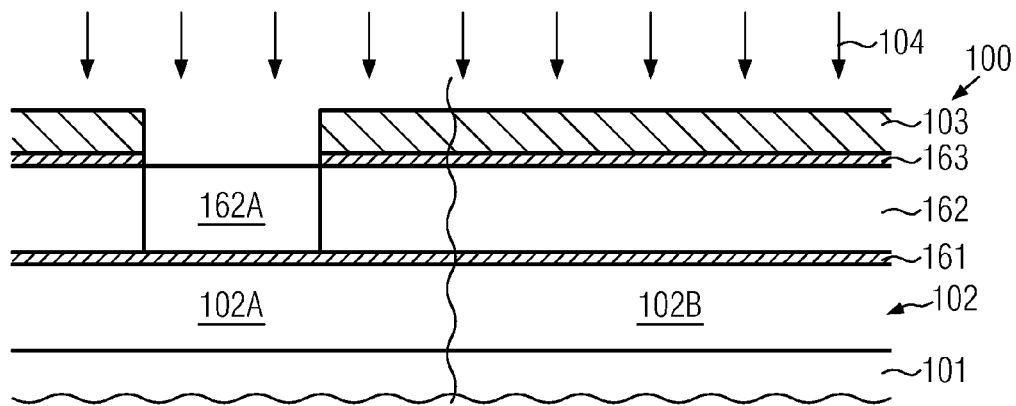
Figure 1C:
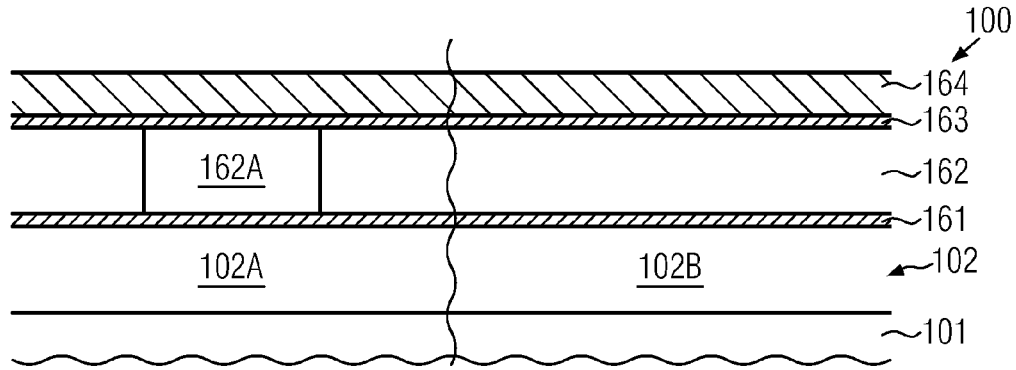
Figure 1D:
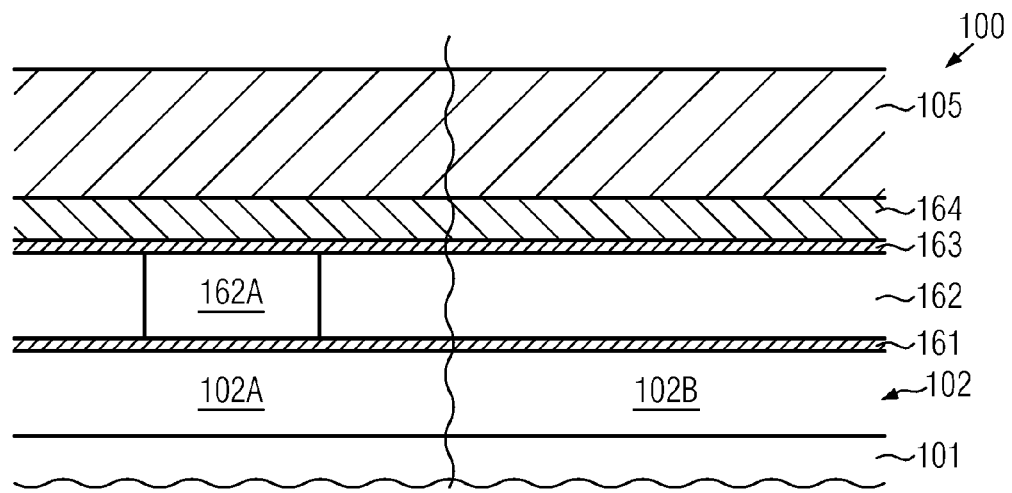
Figure 1E:
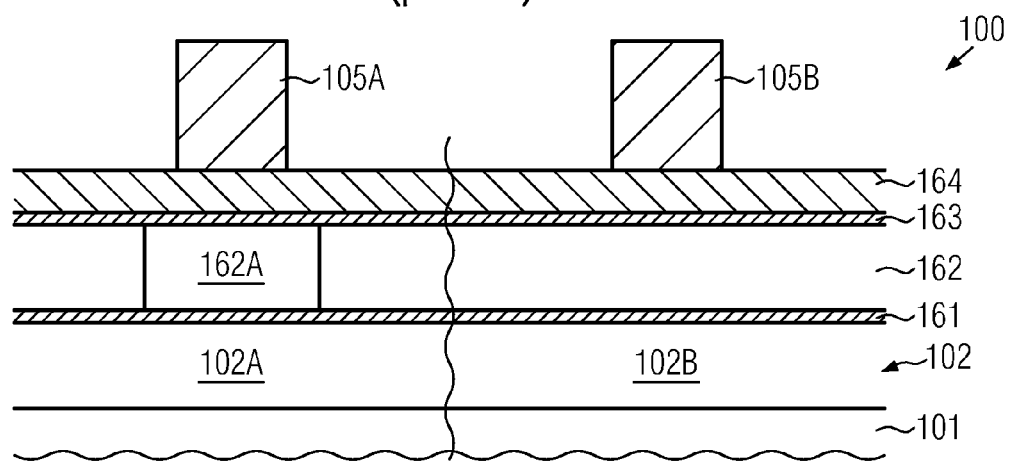
Figure 1F:
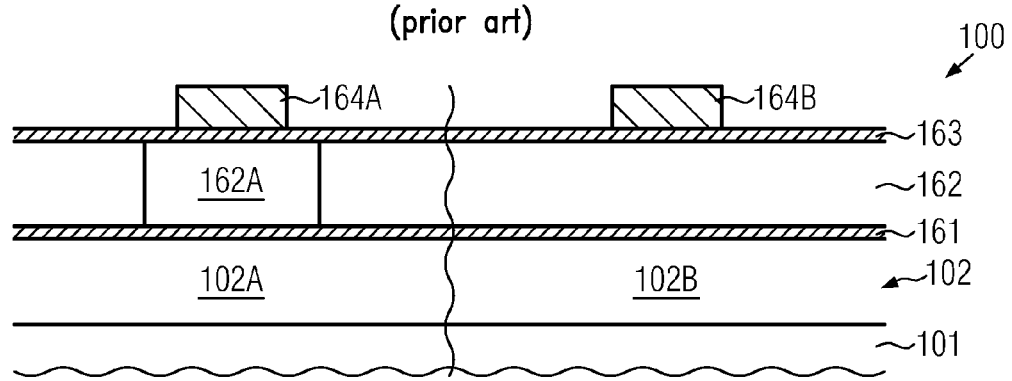
Figure 1G:
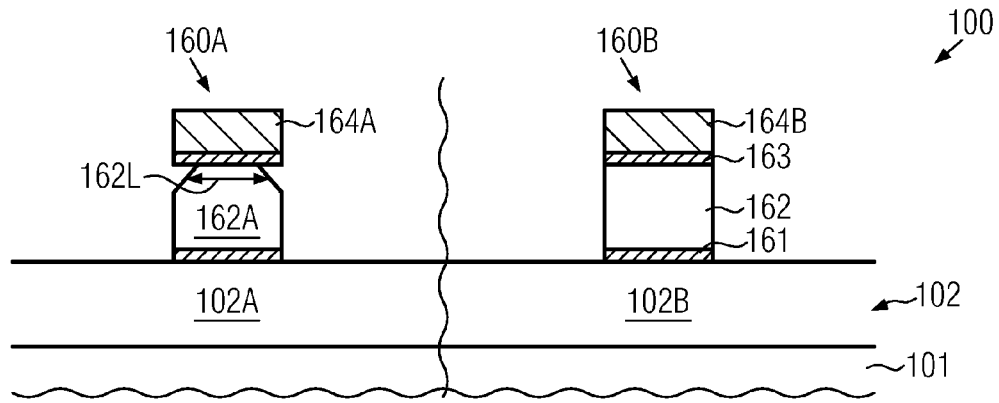

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

Detailed Description

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally contemplates manufacturing techniques and resulting semiconductor devices in which superior uniformity of gate profiles and high flexibility in selecting appropriate lithography and patterning strategy may be achieved by avoiding an implantation process for pre-doping one type of gate electrode material, which may conventionally result in deteriorated gate profile of at least one type of transistor or which may conventionally require sophisticated soft mask approaches, thereby significantly restricting the overall process flexibility. The superior uniformity of the gate profiles for any type of transistors may be accomplished by performing a required pre-doping of, for instance, one type of gate electrode structure after the patterning sequence by using an appropriate masking regime in which any other gate electrode structures and in particular the active regions of the transistors may be reliably covered in order to avoid undue penetration of dopant species into at least one type of active region. To this end, appropriate planarization materials in combination with resist materials may be applied so as to mask the active regions and provide an implantation mask for selecting specific gate electrode structures, which are to receive the pre-doping dopant species. In this manner, additional lithography steps compared to the conventional process strategy may be avoided.

With reference to FIGS. 2a-2i, further illustrative embodiments will now be described in more detail, wherein reference may also be made to FIGS. 1a-1g, if appropriate.

Figure 2A:
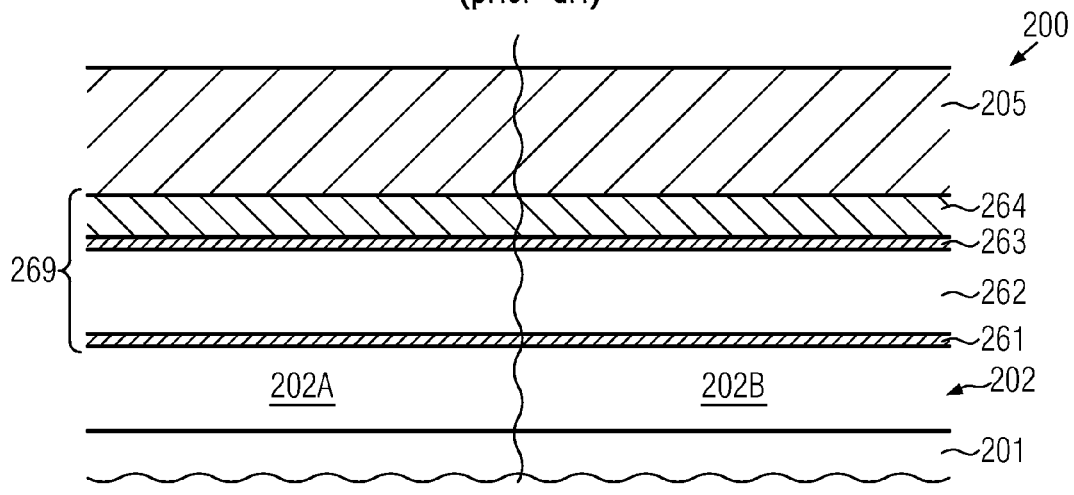
FIGS. 2a-2i schematically illustrate cross-sectional views of a semiconductor device during various manufacturing stages in forming sophisticated semiconductor-based gate electrode structures with superior uniformity of the gate profile, according to illustrative embodiments.

FIG. 2a schematically illustrates a cross-sectional view of a semiconductor device 200 comprising a substrate 201 and a semiconductor layer 202 formed thereon, such as a silicon layer, a silicon/germanium layer and the like. The semiconductor layer 202 and the substrate 201 may represent a bulk configuration in which the layer 202 may be a portion of a crystalline material of the substrate 201. In other cases, an SOI configuration may be used when a buried insulating material (not shown) may be formed below the semiconductor layer 202. Moreover, as also discussed above, the semiconductor layer 202 may comprise a plurality of semiconductor regions or active regions, in and above which corresponding transistor elements are to be formed. For example, active regions 202A, 202B are illustrated, in and above which transistors have to be provided, one of which may require a pre-doping of the corresponding gate electrode material, as is also described above with reference to the device 100. It should be appreciated that the active regions 202A, 202B may be laterally delineated by respective isolation regions (not shown). Moreover, a gate layer stack 269 is formed on the semiconductor layer 202 and comprises a gate dielectric material 261, a semi-conductor-based electrode material 262, such as a polysilicon material, a silicon/germanium material, a germanium material and the like, followed by an etch stop or passivation layer 263, for instance in the form of an oxide material. In this manufacturing stage, a hard mask material layer 264, for instance provided in the form of an oxide material, a nitride material and the like, may be provided, wherein superior flexibility in selecting any desired material may be achieved due to the superior uniformity of the further patterning process. Furthermore, a layer 205, which may comprise any appropriate materials for establishing appropriate conditions for the subsequent patterning of the hard mask layer 264, may be provided, for instance, comprising planarization materials, ARC coating materials, resist materials and the like.

The semiconductor device 200 as shown in FIG. 2a may be formed on the basis of any well-established process strategy. For example, process techniques may be applied as are also previously discussed with reference to the semiconductor device 100. It should be appreciated that, in particular, the semiconductor-based electrode material 262 may be provided with "uniform" material characteristics, for instance in terms of crystallinity and in particular with respect to a dopant concentration. For example, in some illustrative embodiments, the material 262 may be provided as a substantially non-doped material, while, in other cases, a very uniform dopant concentration may be incorporated, if compatible or required for the further processing. It should be appreciated, however, that the term "uniform" may include any process-specific unintentional material variations, which may be caused by any imperfections of material sources, deposition tools and the like. Consequently, the material 262 may be provided at a stage in which any sophisticated patterning recipes may be adapted so as to obtain a very uniform etch behavior when patterning the electrode material 262, as is also discussed above.

Figure 2B:
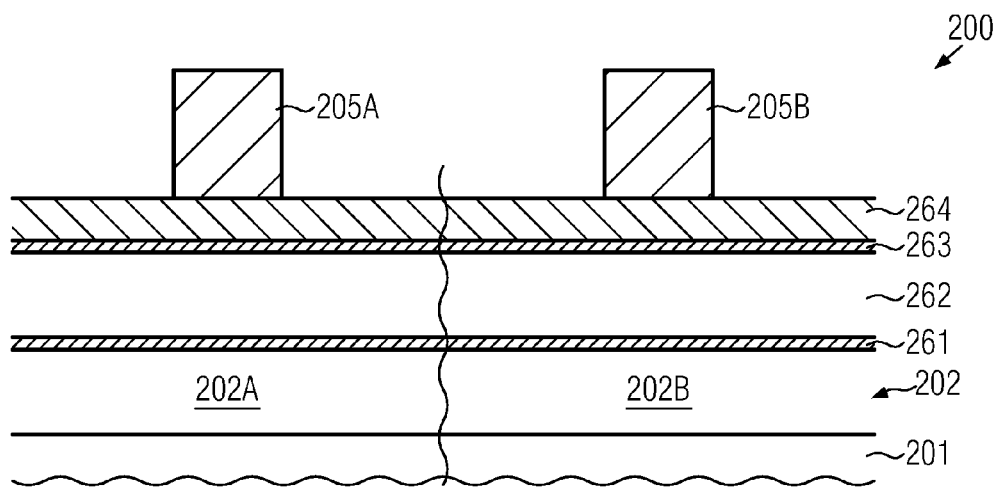

FIG. 2b schematically illustrates the device 200 with a first mask feature 205A and a second mask feature 205B, which may be formed from the layer or layer system 205 (FIG. 2a) based on any desired lithography strategy.

Figure 2C:
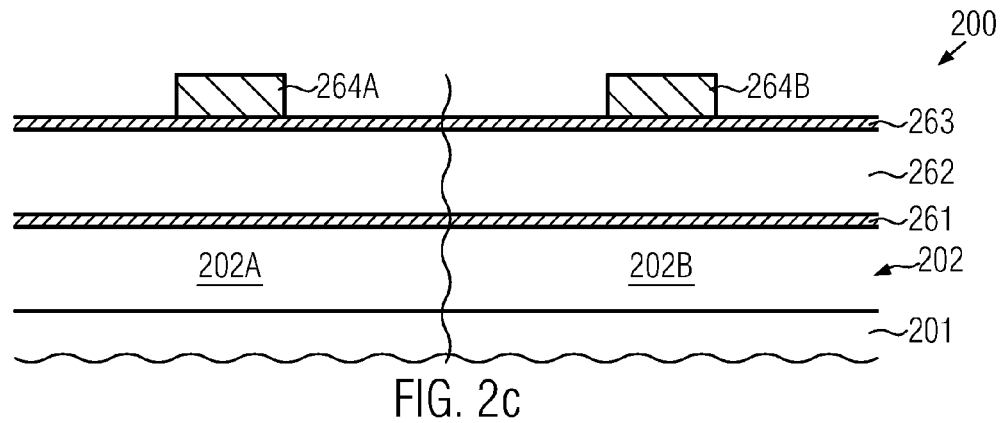

FIG. 2c schematically illustrates the device 200 in a further advanced manufacturing stage in which hard mask features 264A, 264B, which may substantially correspond to the desired lateral dimensions of the gate electrode structures still to be formed, may be provided above the layer 262 and the layer 263, which may be accomplished by applying a patterning regime based on the mask features 205A, 205B (FIG. 2b), wherein any appropriate process strategy may be applied, such as double patterning strategies and the like. On the basis of the mask features 264A, 264B, the further processing may be continued by opening the layer 263 and etching through the semiconductor electrode material 262 based on an appropriate anisotropic etch recipe, using the gate dielectric material as an efficient etch stop layer. As discussed above, during a corresponding patterning strategy, in particular the lateral dimensions and thus gate length at the bottom of the resulting gate electrode structures may have to be adjusted in a highly controllable manner, wherein, however, also the resulting cross-sectional shape may be obtained with superior uniformity, i.e., very steep sidewalls may be formed due to the high degree of uniformity of the semiconductor material 262.

Figure 2D:
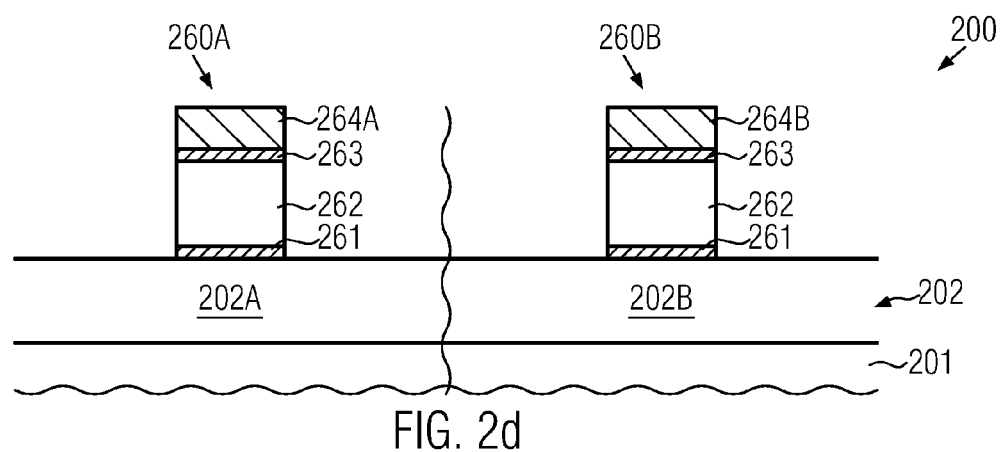

FIG. 2d schematically illustrates the semiconductor device 200 with gate electrode structures 260A, 260B including the mask features 264A, 264B, respectively, wherein a superior cross-sectional shape may be obtained for both gate electrode structures due to the superior uniformity of the preceding patterning process. In some illustrative embodiments, the further processing may be continued by removing the hard mask features 264A, 264B, which may be accomplished on the basis of highly selective etch techniques, such as plasma assisted etch recipes, wet chemical etch recipes and the like. For example, in some illustrative embodiments, an oxidation process may be performed so as to oxidize any exposed semiconductor areas and thereafter the mask materials 264A, 264B may be removed, for instance when comprised of silicon nitride, by using hot phosphoric acid, selective plasma-based etch recipes and the like. In other cases, a corresponding highly selective etch process may be applied without providing a specific etch stop material.

Figure 2E:
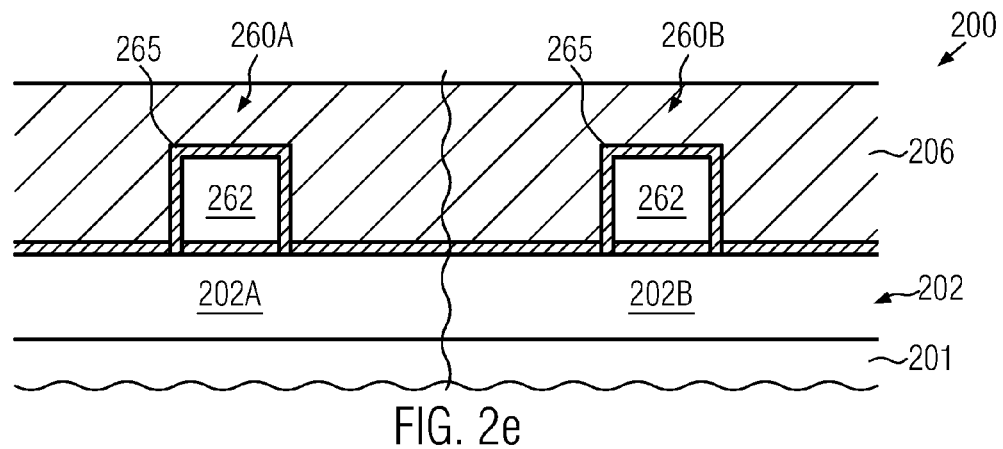

FIG. 2e schematically illustrates the semiconductor device 200 in a further advanced manufacturing stage. As illustrated, the electrode material 262 of the gate electrode structures 260A, 260B may be confined on the basis of a liner 265, such as an oxide material, which may, for instance, also be formed on the surface areas of the semiconductor layer 202. Furthermore, in the embodiment shown, the hard mask materials 264A, 264B (FIG. 2d) have been removed on the basis of any appropriate process strategy. Furthermore, a mask material 206 may be formed so as to cover the gate electrode structures 260A, 260B and the active regions 202A, 202B. To this end, well-known planarization materials, such as polymer materials and the like, may be applied, for instance in a low viscous state, while, in other cases, any other appropriate deposition technique may be applied. For example, amorphous carbon material may be deposited on the basis of well-established CVD techniques and may possibly be planarized, based on chemical mechanical polishing (CMP) and the like.

Figure 2F:
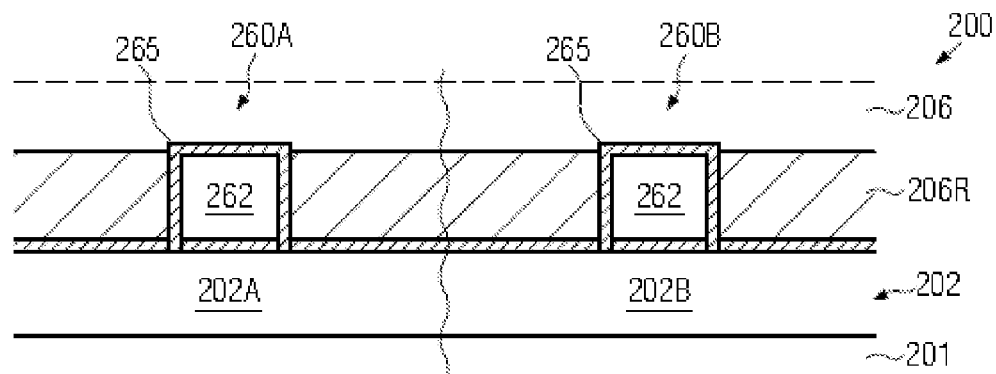

FIG. 2f schematically illustrates the semiconductor device 200 according to some illustrative embodiments in which the mask material 206 may be removed in thickness, for instance by performing an etch process and the like, thereby obtaining the reduced mask material 206R. In this manner, any appropriate height and thus masking effect for a subsequent implantation process may be adjusted. In some illustrative embodiments (not shown), a corresponding reduction of the initial thickness of the material 206 may result in an exposure of at least a top surface of the gate electrode structures 260A, 260B, wherein, in some cases, the hard mask layers 264A, 264B (FIG. 2d) may still be in place. In this case, these hard mask features may be efficiently removed, for instance, by plasma-based etch recipes, wet chemical etch recipes, wherein the material 206R may act as an efficient etch mask, thereby avoiding any undue interaction with the active regions 202A, 202B and also providing superior integrity of the electrode material 262.

Figure 2G:
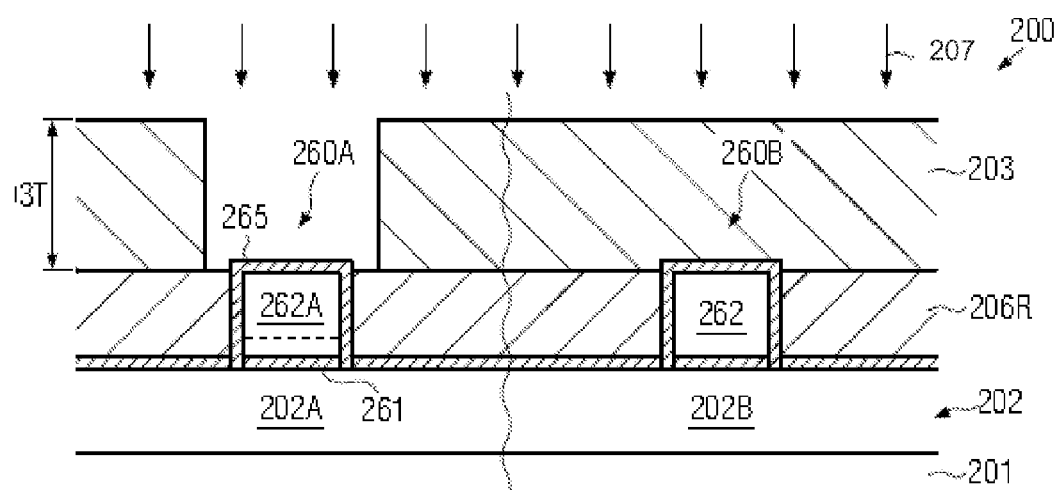

FIG. 2g schematically illustrates the semiconductor device 200 in a further advanced manufacturing stage in which an implantation mask 203 may be formed so as to cover those gate electrode structures in which a pre-doping is not required. In the example shown, the mask 203 may cover the gate electrode structure 260B, while the gate electrode structure 260A is exposed to an ion bombardment 207, during which an appropriate dopant species may be incorporated into the electrode material 262, thereby forming a modified or doped portion 262A therein. It should be appreciated that the implantation parameters, in particular the energy during the implantation process 207, are appropriately selected so as to avoid undue penetration of sensitive device areas, such as the gate dielectric material 261 and the active region 202A, i.e., a channel area thereof. To this end, experiments and/or simulations may be performed in order to obtain appropriate energy values. Furthermore, generally the thickness of the layer 203, as indicated by 203T, in combination with the thickness of the mask material 206R, are appropriately selected so as to substantially avoid the incorporation of dopant species in the material 262 of the gate electrode structure 260B. In the embodiment shown, the material 203 may provide sufficient ion blocking capabilities, while, in other cases, an additional access height of the reduced material 206R above the gate electrode structures 260A, 260B may provide, in combination with the material 203, the required ion blocking effect. In this case, the resulting penetration depth in the gate electrode structures 260A may be less, which, however, may be taken into consideration during the further processing of the device 200.

It should be appreciated that the resist material 203 may be formed on the basis of well-established lithography techniques, wherein the patterning of the material 203 may be accomplished in a selective manner with respect to the material 206R. To this end, the material 206R may be substantially insensitive to any developer materials for the resist layer 203, while, in other cases, the mask material 206R may be provided in the form of material having superior etch resistivity, for instance when provided in the form of amorphous carbon and the like.

After the implantation process 206, the processing may be continued by removing the layers 203 and 206R, which, in some illustrative embodiments, may be accomplished on the basis of oxygen plasma-assisted etch recipes, possibly in combination with additional cleaning processes, wherein integrity of the materials 262 and 262A may be preserved on the basis of the encapsulation 265.

Figure 2H:
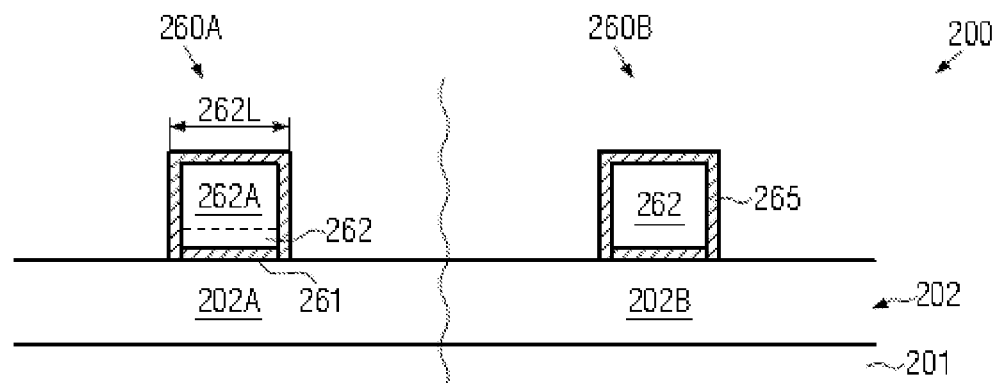

FIG. 2h schematically illustrates the device 200 after the above-described process sequence. Hence, the gate electrode structure 260A may comprise the doped portion 262A in combination with the portion 262, which may have substantially the initial material characteristics. Similarly, the gate electrode structure 260B may comprise the initial electrode material 262. Consequently, the gate electrode structures 260A, 260B may still have a superior cross-sectional shape and a corresponding gate length 262L at the bottom thereof, which may thus represent the electrically effective gate length, wherein a desired degree of tapering (not shown) or nearly vertical walls of the gate electrode structures 260A, 260B may be achieved, irrespective of the pre-doped area 262A. Consequently, the further processing may be continued on the basis of superior process conditions so that, in addition to superior uniformity of the gate electrode structures 260A, 260B, the respective transistors may be completed and may also exhibit a significantly reduced degree of variability of the resulting transistors characteristics.

Figure 2I:
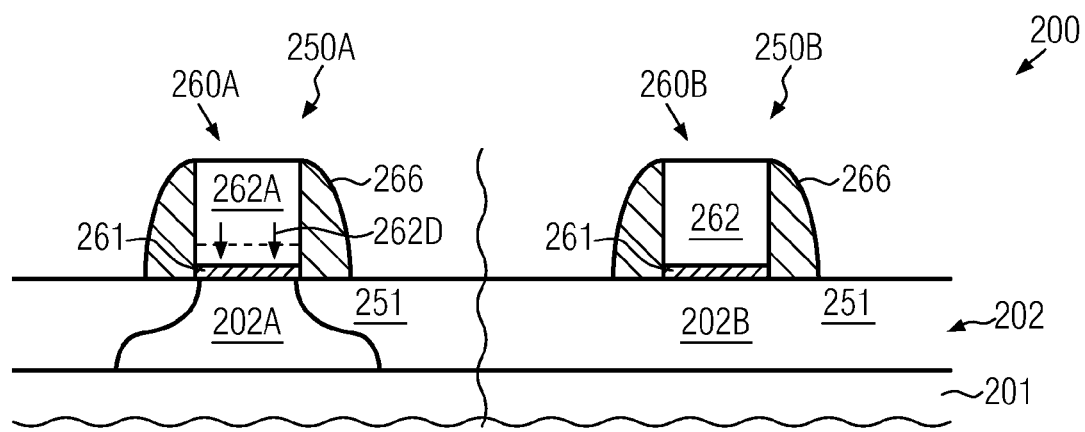

FIG. 2i schematically illustrates the semiconductor device 200 in a further advanced manufacturing stage. As shown, a first transistor 250A may be formed in and above the active region 202A and may comprise drain and source regions 251 in accordance with the overall transistor requirements. Moreover, the gate electrode structure 260A may comprise an additional sidewall spacer structure 266, which may be used for forming the desired lateral and vertical profile of the drain and source regions 251. Similarly, a second transistor 250B may be formed in and above the active region 202B and may comprise corresponding drain and source regions 251, which may also be formed on the basis of a sidewall spacer structure 266 of the gate electrode structure 260B. The transistors 250A, 250B may be formed on the basis of any appropriate process strategy, for instance forming one or more spacer elements of the structure 266 (not shown) and incorporating appropriate dopant species, such as drain and source extension dopants, counter-doping species for forming halo regions and the like, as may be required for implementing the complex dopant profile. Thereafter, the spacer structure 266 may be completed and any further dopant species may be incorporated. It should be appreciated that, during these implantation processes, also the respective dopant species may be incorporated into the gate electrode structures 260A, 260B. Consequently, in combination with the pre-doped portion 262A, a desired dopant profile and concentration may be obtained in the gate electrode structure 260A. Moreover, upon performing any anneal processes, as may be used for activating the dopants of the drain and source regions 251 and re-crystallizing implantation-induced damage, also a diffusion may take place from the pre-doped portion 262A in lower-lying areas, as indicated by 262D, thereby adjusting the final dopant profile and concentration in the vicinity of the gate dielectric material 261.

As a result, the present disclosure provides manufacturing techniques in which the pre-doping of a semiconductor-based electrode material may be accomplished after the patterning of the gate electrode structures, which may thus result in superior uniformity of the patterned electrode materials. The pre-doping may be performed in a separate implantation process by using a mask material in combination with an implantation mask, thereby avoiding undue dopant incorporation into active regions. Consequently, superior flexibility may be provided with respect to selecting an appropriate lithography strategy for patterning a hard mask, while also any well-established concept for hard mask materials, resist materials and the like may be applied without being restricted to very narrow process windows, as is the case in conventional strategies in which a gate patterning may be performed on the basis of a soft mask approach in order to reduce patterning-related non-uniformities of the resulting gate profile.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
   forming a gate layer stack above a first active region and a second active region, said gate layer stack comprising a semiconductor electrode material having a uniform material composition;
   forming a first gate electrode structure above said first active region and a second gate electrode structure above said second active region from said gate layer stack;
   forming a mask material laterally adjacent to said first and second gate electrode structures so as to cover said first and second active regions;
   forming a patterned implantation mask above said mask material, said patterned implantation mask covering said second gate electrode structure and exposing said first gate electrode structure;
   implanting a dopant species selectively into said semiconductor electrode material of said first gate electrode structure through said patterned implantation mask and in the presence of said mask material;
   removing said patterned implantation mask and said mask material from above said first and second active regions during a same material removal process; and performing an anneal process so as to distribute said dopant species.

2. The method of claim 1, wherein said first and second gate electrode structures are formed with a gate length of 40 nm or less.

3. The method of claim 1, wherein forming said first and second gate electrode structures comprises forming a hard mask above said gate layer stack and patterning said gate layer stack by using said hard mask.

4. The method of claim 3, further comprising removing said hard mask prior to forming said mask material.

5. A method of forming gate electrode structures, the method comprising:
   forming a first gate electrode structure and a second gate electrode structure from a gate layer stack, said first and second gate electrode structures being formed above first and second semiconductor regions, respectively;
   incorporating a dopant species selectively into a semiconductor electrode material of said first gate electrode structure while masking said first and second semiconductor regions and said second gate electrode structure, wherein masking said first and second semiconductor regions and said second gate electrode structure comprises forming a mask material so as to at least laterally enclose said first and second gate electrode structures and forming a resist mask above said mask material;
   after incorporating said dopant species selectively into said semiconductor electrode material of said first gate electrode structure, removing said resist material and said mask material from above said first and second semiconductor regions during a same material removal process; and
   performing an anneal process so as to distribute said dopant species.

6. A method, comprising:
   forming a gate layer stack above first and second active regions of a semiconductor device, said gate layer stack comprising an electrode material including a semiconductor material;
   patterning said gate layer stack so as to form a first gate electrode structure from said gate layer stack above said first active region and a second gate electrode structure from said gate layer stack above said second active region;

forming a mask material above said semiconductor device, said mask material covering said first and second active regions and said first and second gate electrode structures;

forming a layer of resist material above said mask material;

patterning said layer of resist material so as to form a patterned implantation mask that exposes said first gate electrode structure;

performing an implantation process through said patterned implantation mask so as to incorporate a dopant species into said semiconductor material of said electrode material of said first gate electrode structure; and removing said patterned implantation mask and said mask material from above said first and second active regions during a same material removal process.

7. The method of claim 6, wherein at least one of said first and second gate electrode structures is formed with a gate length of 40 nm or less.

8. The method of claim 6, wherein patterning said gate layer stack comprises forming a patterned hard mask above said gate layer stack and performing an etch process on said gate layer stack using said patterned hard mask as an etch mask.

9. The method of claim 8, further comprising removing said patterned hard mask from above at least said first gate electrode structure prior to performing said implantation process.

10. The method of claim 9, wherein said patterned hard mask is removed from above at least said first gate electrode structure in the presence of said mask material.

11. The method of claim 8, further comprising removing said patterned hard mask prior to forming said mask material.

12. The method of claim 6, wherein performing said implantation process comprises adjusting a penetration depth of said dopant species so as to substantially avoid penetration of said implanted dopant species into a gate dielectric layer of said first gate electrode structure.

13. The method of claim 12, wherein forming said mask material comprises forming an organic material above said first and second active regions and said first and second gate electrode structures and adjusting a height level of an upper surface of said organic material so as to substantially avoid penetration of said implanted dopant species into said gate dielectric layer of said first gate electrode structure.

14. The method of claim 13, wherein adjusting said height level of said upper surface of said organic material comprises performing an etch process to remove an upper thickness portion of said mask material.

15. The method of claim 6, wherein said implantation process is performed prior to incorporating drain and source region dopant species into said first active region.

16. The method of claim 8, wherein forming said patterned hard mask above said gate layer stack comprises forming a layer of hard mask material, forming a patterned masking layer above said layer of hard mask material, and using said patterned masking layer to pattern said layer of hard mask material and form said patterned hard mask, the method further comprising removing said patterned masking layer from above said patterned hard mask prior to performing said etch process on said gate layer stack.

17. The method of claim 6, further comprising forming an encapsulating liner layer above said first and second active regions, said encapsulating liner layer completely covering an entirety of sidewall and upper surfaces of each of said first and second gate electrode structures, wherein said mask material is formed to cover at least a portion of said encapsulating liner layer that is formed above said first and second active regions.

18. The method of claim 17, wherein said patterned implantation mask covers an entirety of said second active region including said second gate electrode structure and covers at least a portion of said first active region and exposes at least a portion of said encapsulating liner layer that covers said first gate electrode structure.

19. The method of claim 1, further comprising, prior to forming said mask material, forming an encapsulating liner layer that covers said first and second active regions including an entirety of sidewall and upper surfaces of each of said first and second gate electrode structures, wherein said dopant is implanted selectively into said semiconductor electrode material of said first gate electrode structure while said encapsulating liner layer is covering said entirety of said sidewall and upper surfaces of each of said first and second gate electrode structures.

20. The method of claim 1, wherein implanting said dopant species selectively into said semiconductor electrode material of said first gate electrode structure comprises adjusting a penetration depth of said dopant species so as to be less than a height of said semiconductor electrode material.

21. The method of claim 5, wherein said dopant species is incorporated selectively into said semiconductor electrode material of said first gate electrode structure while an encapsulating liner layer is covering an entirety of sidewall and upper surfaces of each of said first and second gate electrode structures.

22. The method of claim 5, wherein incorporating said dopant species selectively into said semiconductor electrode material of said first gate electrode structure comprises adjusting a penetration depth of said dopant species so as to be less than a height of said semiconductor electrode material.

* * * * *